United States Patent [19]
Bockelman

[11] Patent Number: 5,389,735
[45] Date of Patent: Feb. 14, 1995

[54] VERTICALLY TWISTED-PAIR PLANAR CONDUCTOR LINE STRUCTURE

[75] Inventor: David E. Bockelman, Plantation, Fla.

[73] Assignee: Motorola, Inc., Schaumburg, Ill.

[21] Appl. No.: 115,368

[22] Filed: Aug. 31, 1993

[51] Int. Cl.$^6$ .................. H01B 11/02; H01P 5/00; H01P 3/08

[52] U.S. Cl. .................... 174/33; 174/34; 174/261; 333/4; 333/238

[58] Field of Search ............ 174/32, 33, 34, 250, 174/261, 262; 333/1, 4, 238, 245

[56] References Cited

U.S. PATENT DOCUMENTS

| Re. 27,089 | 3/1971 | Sear | 317/101 |
|---|---|---|---|
| 3,185,947 | 5/1965 | Freymodsson | 336/200 |
| 3,447,120 | 5/1969 | Rask | 333/1 |
| 3,454,906 | 7/1969 | Hyltin | 333/238 |
| 3,573,665 | 4/1971 | Knerr | 333/238 |
| 3,757,028 | 9/1973 | Schlessel | 174/33 |
| 4,091,529 | 5/1978 | Zaleckas | 29/628 |
| 4,626,889 | 12/1986 | Yamamoto et al. | 357/71 |
| 4,831,497 | 5/1989 | Webster et al. | 361/406 |
| 4,845,313 | 7/1989 | Endoh | 174/68.5 |
| 4,982,892 | 1/1991 | Parla | 228/180.1 |
| 5,010,448 | 4/1991 | Kobari | 361/403 |
| 5,036,160 | 7/1991 | Jackson | 333/238 |
| 5,039,824 | 8/1991 | Takashima et al. | 174/33 |
| 5,250,759 | 10/1993 | Watson | 174/261 |

FOREIGN PATENT DOCUMENTS

| 53-76387 | 6/1978 | Japan | 174/34 |
|---|---|---|---|
| 54-42677 | 4/1979 | Japan | 174/34 |
| 1600609 | 5/1992 | U.S.S.R. | 174/250 |

Primary Examiner—Leo P. Picard
Assistant Examiner—Stephen T. Ryan
Attorney, Agent, or Firm—Juliana Agon; Frank M. Scutch, III

[57] ABSTRACT

A twisted-pair conductor line structure is formed on a substrate (22) having insulated conductive layers (31, 32). The conductive layers are used to form first, second, third, and fourth conductive planar segments (40, 41, 42, 43). A first conductive link (44) joins the first and second planar conductive segments to provide a first signal path. Similarly, a second conductive link (46) joins the third and fourth planar conductive segments to provide a second signal path. The first and second conductive links are operatively arranged to form a twist (17) in the first and second signal paths, such that the resulting magnetic fields (57, 59) around the twisted conductive segments will be opposite to each other for cancelling each other out, in order to reduce the magnetic field radiation to the surrounding environment.

5 Claims, 4 Drawing Sheets

VERTICALLY TWISTED-PAIR PLANAR CONDUCTOR LINE STRUCTURE

CROSS REFERENCE TO RELATED APPLICATIONS

This application is related to the following U.S. applications: U.S. Ser. No. 08/115,175 by David E. Bockelman and Douglas H. Weisman, entitled "A Horizontally Twisted-Pair Planar Conductor Line Structure," to U.S. Ser. No. 08/115,176 by David E. Bockelman, entitled "A Twisted-Pair Planar Conductor Line Off-Set Structure," U.S. Ser. No. 08/115,174 by and Douglas H. Weisman, entitled "A Twisted-Pair Wire Bond and Method Thereof," and to U.S. Ser. No. 08/115,291 by David E. Bockelman and Robert E. Stengel, entitled "Interconnection Structure for Crosstalk Reduction to Improve Off-Chip Selectivity," all filed concurrently herewith and all assigned to Motorola, Inc.

BACKGROUND

This invention relates to miniaturized circuits and more particularly to the transmission line interconnection of these circuits.

A transmission line is generally formed by two conductors. When any two or more circuits are interconnected, by at least one transmission line, a certain amount of signal from one circuit may couple into an otherwise isolated circuit. The resulting induced signal is called crosstalk. For example, when a signal is transmitted to a subsequent circuit across the two conductors from a high frequency signal source, such as an antenna received radio frequency (RF) signal from an RF amplifier to a mixer, in one path, or in a reversed direction, a generated signal from a modulator to a transmitter, in the same radio or transceiver, undesired cross-talk coupling can degrade the performance of the radio transceiver.

If one of the two conductors of the transmission line coupling the circuits is used as a grounding conductor, the circuit is referenced as single-ended and the transmission line is a single-ended transmission line.

Otherwise, two non-grounded conductors form a differential transmission line for a differential circuit. The geometry of the two conductors, and their relative positions, are set to establish a characteristic impedance to properly match the impedance from the first differential circuit to the subsequent differential circuit. A differential signal is applied across the two conductors by one differential generating circuit, and the signal travels down the transmission line to the differential receiving circuit, where the signal is measured as the difference between the two conductors. In other words, a differential circuit generates or receives a pair of complementary signals in a phase-inverted relation with each other, known together as a single differential signal.

The substitution of a differential transmission line for a single-ended transmission line can greatly reduce one type of crosstalk coupling called common-mode impedance coupling. Common-mode impedance coupling in a single-ended (non-differential) transmission line is caused by a non-zero parasitic impedance, generally called a ground-return resistance, that is unintentionally shared by two or more otherwise isolated circuits. This common impedance causes crosstalk. Therefore, by reducing the common or shared impedance of the ground conductor with a non-grounded conductor, common-mode impedance coupling is reduced.

In addition to common impedance coupling between circuits, there could also be capacitive (electric) and inductive (magnetic) coupling between the two conductors of the same transmission line if the two conductors are close together.

In the case of two adjacent transmission lines, differential transmission lines can also reduce the capacitive, or electric field, coupling and inductive, or magnetic field, coupling between the differential transmission lines, relative to single-ended transmission lines, such as cross-talk between the mixer and the modulator, if the distance between the two transmission lines is much larger than the separation between the conductors of one of the transmission lines. In the magnetic field coupling case, the magnetic fields around the adjacent conductor lines of each of the transmission lines will be opposite to each other to substantially cancel each other, thus reducing magnetic field radiation to the surrounding environment.

However, space is generally limited in these miniaturized applications, such as in a radio. Therefore, these differential transmission lines must be close together, which also increase the magnetic coupling and decrease the advantage of differential lines over single-ended lines.

A further reduction in crosstalk, over the plain differential line, for the two dose conductors of the same differential line or for two dose differential lines, can be achieved by twisting the two conductors to form a twisted-pair differential transmission line. This type of line is commonly implemented with two insulated round wires which are twisted about each other. This type of line can reduce crosstalk by reducing the inductive, or magnetic field, coupling. The crosstalk reduction is achieved by reducing the magnetic loop area of the line, and by changing the orientation of the magnetic field continuously over the length of the line.

An un-twisted pair defines a magnetic, or current, loop area over the entire length of the differential transmission line, with the wires being the long sides of a "rectangle". The area of such a loop defines the amount of current that can be induced in the wires by an external magnetic field, such as from an adjacent conductor.

By twisting the wires together, the loop area is minimized. The dimensions of the wire, and the number of twists per inch define the transmission lines characteristic impedance. Furthermore, the remaining loop is now twisted down the length of the transmission line, so that the normal to the magnetic loop area traces a spiral. When two such twisted pair lines are placed close together, the spiraling normals of the twists reduce the ability for the magnetic fields of one pair to induce a current in the other, such as from the modulator to the amplifier, if the circuits are closely spaced.

When interconnecting miniature circuits, such as printed circuits on a printed circuit board or a flexible circuit substrate, integrated circuits (ICs) on a semiconductor substrate, or hybrid circuits, the concept of differential transmission lines can be applied to reduce crosstalk. These conductors are planar because they lie in one or more planes. The differential transmission line can be implemented with both conductors in the same plane (horizontally configured) or in two different planes (vertically configured). In these situations, a general differential transmission line reduces the common-mode impedance coupling. However, since space is generally limited in these miniaturized applications, such as in a radio, these differential transmission lines must be close together, which increase the magnetic coupling.

The problem of magnetic coupling between two planar differential transmission lines can be solved in a similar fashion as for the twisted-pair wire. In U.S. Pat. No. 5,039,824, Takashima et al use conductive through-holes or vias of a printed circuit board to interconnect and form a twisted-pair equal-width planar structure. However, Takashima did not teach the compensation of losses in his structure. Via connections can cause significant ohmic losses and unbalanced equal-width vertically configured conductors can cause parasitic capacitances in the transmission line. Therefore, it is desired to have a low-loss twisted planar transmission line pair that requires no or minimum interconnections between layers.

DETAILED DESCRIPTION OF THE PREFERRED EMBODIMENT

Figure 1:
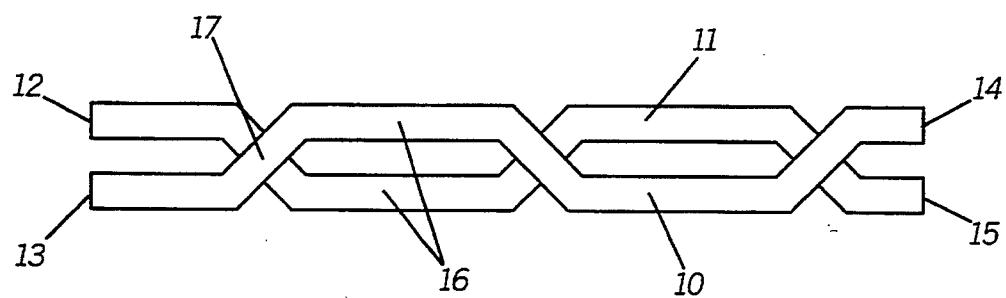
FIG. 1 is a top-view of a horizontally oriented twisted-pair conductor line, in accordance with the present invention.

Referring to FIG. 1, a horizontally oriented transmission line includes two conductors, a top substantially planar conductor 10 and a bottom substantially planar conductor 11 forming two signal paths for a differential signal. Conductor ends or terminals 12 and 13 define an input port of the transmission line, and conductor ends 14 and 15 define an output port. The conductor ends are driven differentially to form differential ports. The width of the conductors 10 and 11 and the horizontal separation between them define the characteristic impedance of the differential transmission line.

Conductors 10 and 11 are vertically separated by a distance that is small compared to the horizontal separation. The conductors 10 and 11, sectionable into conductive un-twisted planar segments and successive conductive twisted segments, are substantially parallel for a certain length during each un-twisted segment or parallel section 16. The conductors, 10 and 11, then cross over one another with overlaid intersecting slanting portions, segments, or links to form an "X" shaped cross 17. The length over which the cross 17 occurs is preferably small relative to the length of the parallel section 16. The relation between the horizontal and vertical separations is illustrated best in FIG. 2.

Figure 2:
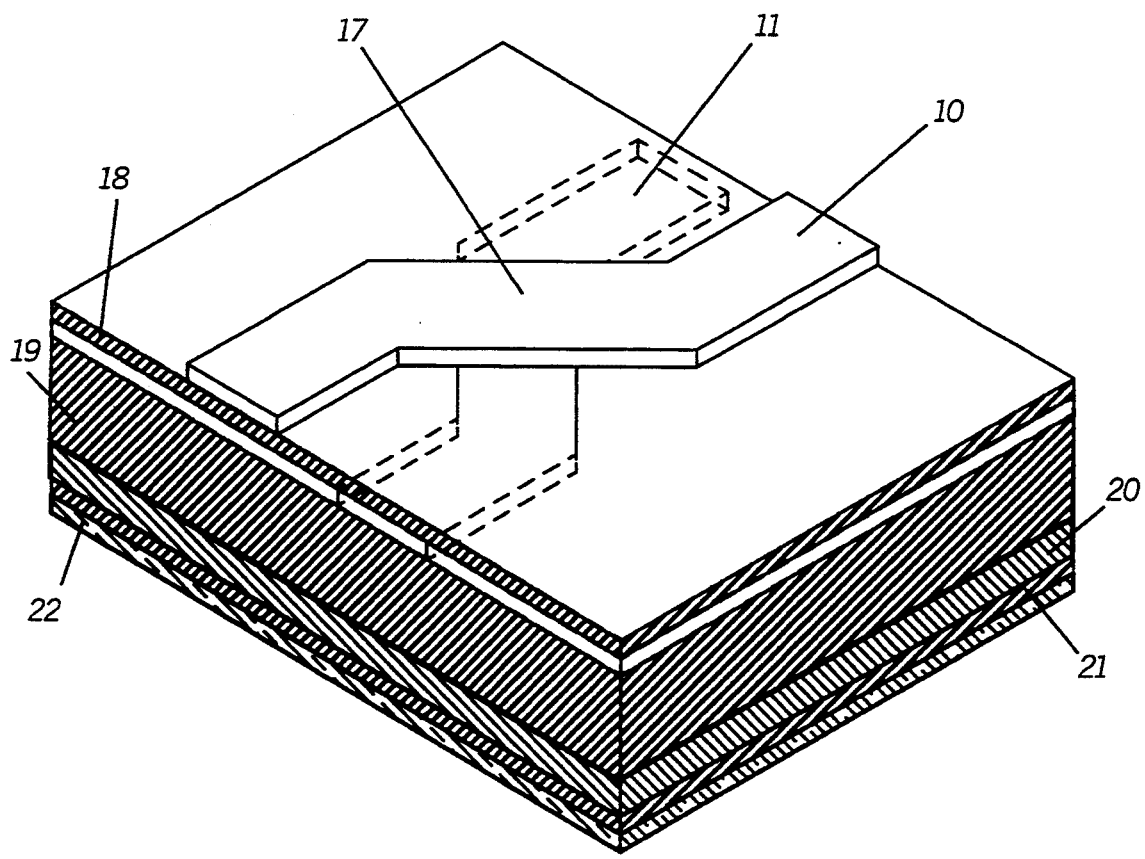
FIG. 2 is a cross section view of the horizontally oriented twisted-pair conductor line of FIG. 1.

Referring to FIG. 2, conductors 10 and 11 are separated by a thin layer of insulating material 18 or by pockets of insulating material (not shown). The conductors 10 and 11 are substantially planar because the top conductor 11 could be disposed on the same plane as the bottom conductor 10, during the parallel sections, and then disposed over the insulating pockets, during the crossed sections. The conductors 10 and 11 can be, but not necessarily, structurally supported by a dielectric layer 19.

To ensure that common-mode coupling is minimized by differential transmission lines, each conductor in a pair must have equal, or balanced, parasitics. In particular, the capacitance to ground of each conductor must be equal. Without this balance, the interconnected circuits experience a common impedance that is related to the amount of parasitic imbalance.

If the conductors 10 and 11 are formed on top of a semiconductor substrate 22, they may be disposed above an intermediate ground plane 20 formed by a highly conductive metallic layer, insulated by an optional insulation layer 21, over the substrate 22. However, if a ground plane 20 is used, the width of the upper conductor 10 is increased or otherwise adjusted to increase its capacitance to ground. For balancing parasitic capacitances, the width of the top conductor 10 is increased approximately in proportion to the increase in vertical distance of the top conductor 10 over the ground plane 20 relative to the height of the lower conductor 11 over the ground plane 20.

Referring back to FIG. 1, the alternating pattern of the cross 17 and the parallel section 16, in two different planes or layers, is repeated over the length of the transmission line. In this manner, the cross 17 and the parallel section 16 simulate a twisted wire pair for reducing crosstalk between circuits.

The magnetic loops in the planar twisted-pair line are defined by the closed current paths between two conductor crossings, or twists. Unlike the true twisted-wire transmission line, the normals to the magnetic loops in the planar twisted-pair lines are all oriented perpendicular to the orientation of the transmission line. That is, for a horizontally configured planar line, the normals to the magnetic loops are all aligned vertically, pointing either "up" or "down" as determined by the current flow in a particular loop. This alignment of the normals, and, hence, the magnetic fields, leads to higher magnetic coupling between planar twisted-pair lines relative to true twisted-wire lines. Therefore, the planar construction of a twisted-pair line is only an approximation of a true twisted-pair transmission line.

The present invention also includes a way of constructing a vertically configured differential transmission line with twists. The vertical transmission line, in certain circumstances, has some advantages over the horizontal version. One advantage is the smaller overall width of the pair, since, with the vertical pair, the conductors are directly atop one another.

Figure 3:
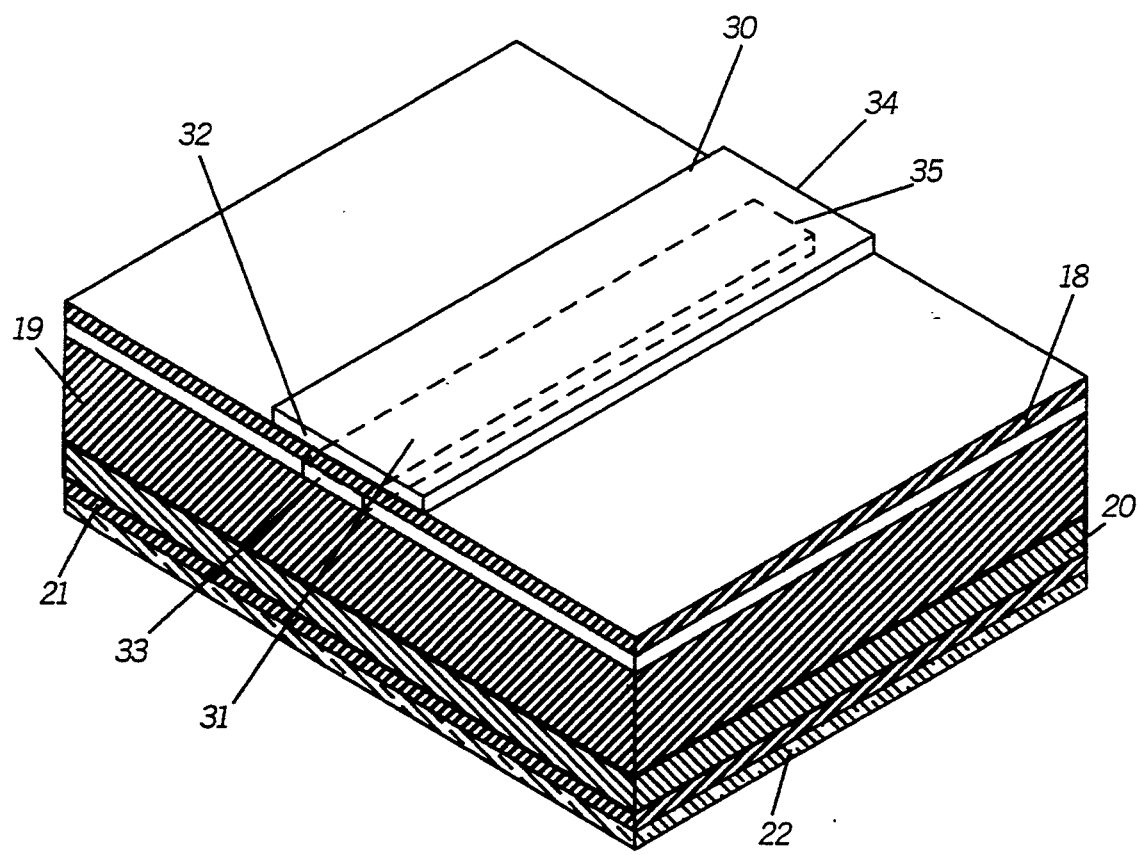
FIG. 3 is a cross section representation of the originating untwisted segments of a vertically oriented twisted-pair conductor line, in accordance with the present invention.

Referring to FIG. 3, a vertically oriented differential transmission line consists of an upper conductor 30 stacked on top of a lower conductor 31, with the two conductors being substantially aligned one atop another. Conductor ends 32 and 33 define a differential input port of the differential transmission line, and conductor ends 34 and 35 define the differential output port. The width of the conductors 30 and 31 and the vertical separation between them define the differential characteristic impedance of the transmission line.

The balance of parasitic capacitances is particularly important in vertical twisted-pair transmission line. Therefore, the top conductor of the vertical line is wider than the lower line by a margin that is determined by the vertical separation. Thus, if the ground plane 20 is used, the width of the upper conductor 30 is adjusted to equalize the capacitances to ground of the upper and lower conductors 30 and 31. For example, the width of the upper conductor 30 is increased to approximately twice the width of the lower conductor 31. This doubling is not exact due to the greater height of the upper conductor 30 over the ground plane 20 relative to the lower conductor 31. However, the alignment of the vertically oriented conductors make it difficult to construct a twist. The present invention provides such a twist in a way that maintains the balance of parasitic behaviors.

Figure 4:
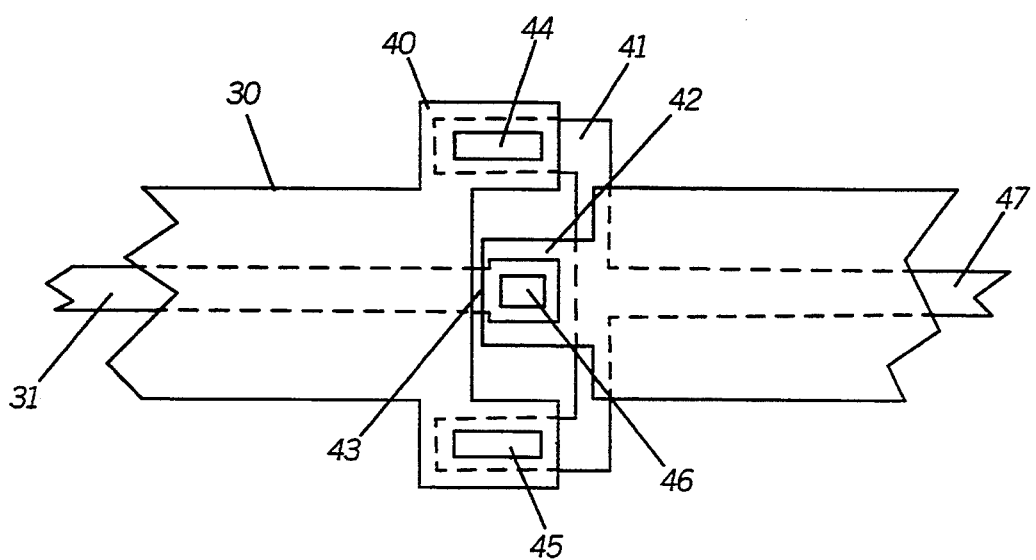
FIG. 4 is a top cut-away view of the vertically oriented twisted-pair conductor line of FIG. 3.

Referring to FIG. 4, a balanced twist in the vertically oriented transmission line of FIG. 3 is formed by branching the upper conductor 30 to form one half of a rectangle, a yoke, or a forcated member having forked sides, such as a "U" shaped wide portion 40. Via conductive through-holes 44 and 45, the upper "U" shaped wide portion 40 links with a lower conductor "U" shaped thinner portion 41 to form a continuous first signal conductor.

The lower conductor 31 extends beyond the base portion 43 of the wider "U" shaped portion 40 underneath of the first signal conductor. A second upper wide conductor 42 having a smaller stub portion mates with the first lower conductor, just beyond the base portion 43 of the upper wide "U" portion 40, with a via 46 providing the connection to form a continuous second signal conductor with the originating lower conductor 31.

The second upper conductor 42 is aligned longitudinally with the original upper conductor 30, in the top plane, and a second lower conductor portion 47 is substantially aligned to the original lower conductor 31, in the bottom plane. The ratio of the widths of the upper conductors 30, 40, and 42 to the lower conductors 31, 41, and 47 is maintained throughout the entire twist structure. This linked structure can be described conceptually as a two over-laid "ball joints" or "universal joints" substantially formed from the overlaid yoked sections, in the shape of a rectangle having a center rectangular aperture through which the parallel section loops through.

Solely twisting the planar differential transmission line, in the vertical or horizontal configuration, improves pair-to-pair cross talk significantly, but it does not necessarily minimize crosstalk. This invention also teaches a system containing two or more adjacent planar twisted transmission line pairs that reduce crosstalk significantly further. When two planar twisted-pair lines are placed together so they are essentially parallel, crosstalk can occur due to magnetic coupling through the loops created by the twists.

Figure 5:
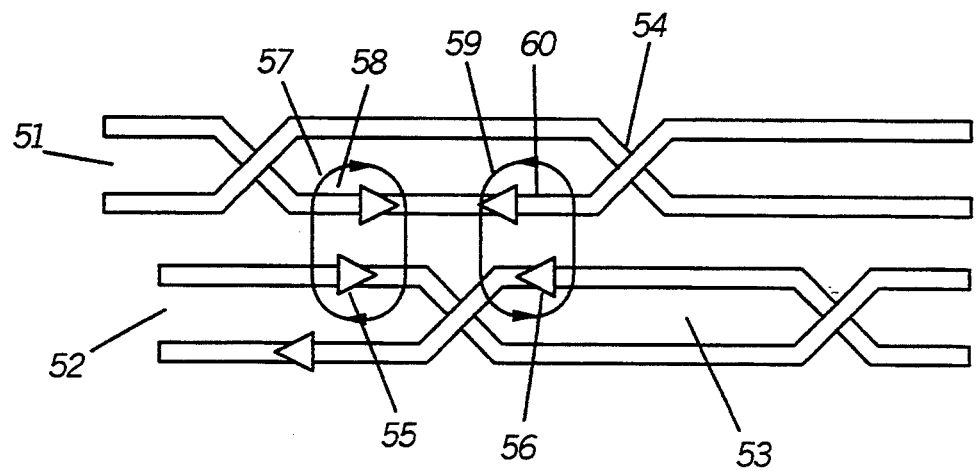
FIG. 5 is a representation of two parallel twisted-pair conductor lines of FIG. 1 or FIG. 4, in accordance with the present invention.

Referring to FIG. 5, a structure for reduced crosstalk using two or more planar differential transmission lines includes at least two transmission lines 51 and 52 that are horizontally oriented as in FIG. 2, vertically oriented as in FIG. 4, or any other types of twisted-pair transmission lines. However, for clarity, the transmission lines 51 and 52 are simply shown as planar twisted pairs oriented horizontally and substantially adjacent for some length. The relative position or offset of the first transmission line 51 with the second transmission line 52 is such that its twists 54 are aligned with the parallel sections 53 of the second transmission line 52. Preferably, the twist or cross 54 coincides with the middle of the parallel section 53; however, off-center alignments can also give improved performance.

In this representation, the signal currents 55 and 56 flowing in the second transmission line 52 are the interferers to the desired signals of the first transmission or victim line 51. The currents 55 and 56 create closed loops of current which in turn generate opposing magnetic fields or fluxes 57 and 59. Hence, the magnetic fluxes 57 and 59 induce currents 58 and 59, flowing in opposite directions, in the victim line 51. With the crosses 54, aligned substantially in the center of the parallel section 53, the substantially equal amount of induced currents 58 and 59 of opposing polarity, are substantially canceled.

FIG. 5 illustrates the offset twisted-pairs with horizontally oriented transmission lines, but the technique applies equally to vertically oriented transmission lines. In such a case, the adjacent lines are vertical twisted pair lines as illustrated in FIG. 4. Here, again, the balanced twists are substantially aligned with the middle of the parallel sections of the adjacent lines.

Figure 6:
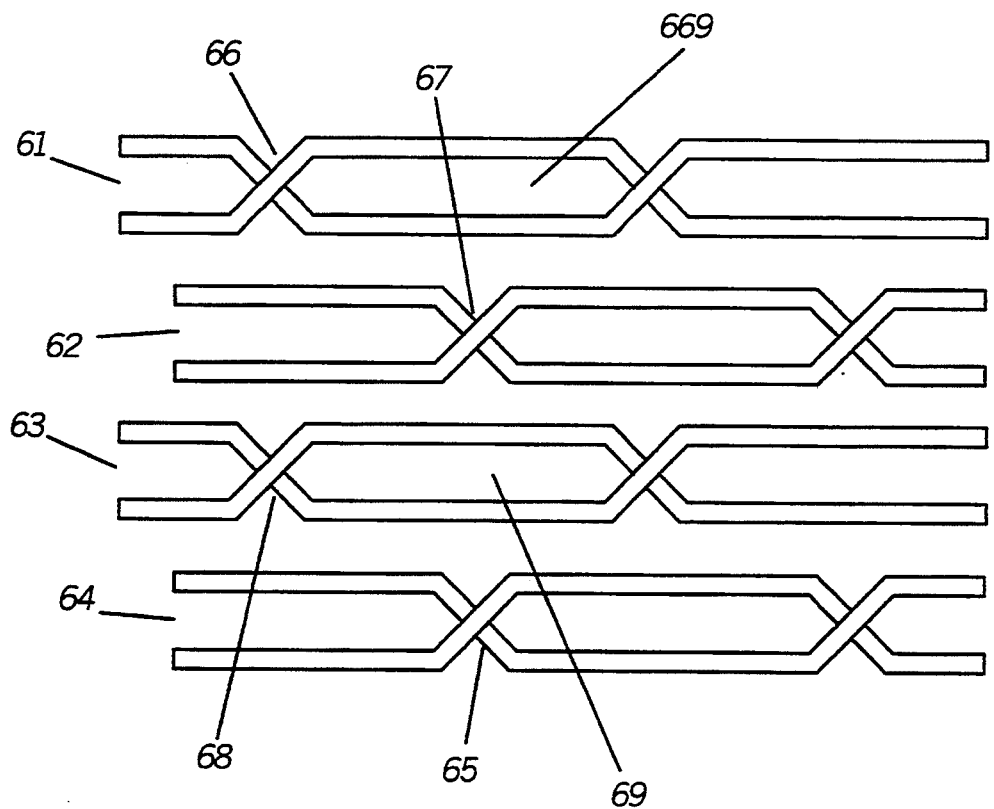
FIG. 6 is a representation of a plurality of parallel twisted-pair conductor lines of FIG. 1 or FIG. 4, in accordance with the present invention.

Referring to FIG. 6, the offset-twists technique can be applied to an arbitrary number of adjacent transmission lines, in either the vertical or horizontal cases. One method alternates the lines such that every other transmission line 61 and 63, has the crosses 66 and 68, respectively, substantially aligned. Simultaneously, the other transmission lines 62 and 64, also aligned to each other, are offset from their nearest neighbor so that the crosses 67 and 65, respectively, are substantially aligned with the middle of the parallel sections 669 and 69, respectively. In such a fashion, any number of adjacent lines, whether they are horizontally or vertically oriented, may be similarly configured. Furthermore, every other line, say 61 and 63, can be offset from each other by some amount or uniform margin. By doing this additional offset, a configuration can be created in which every Nth line is aligned to each other, and the intervening lines can be offset by the uniform margin from their nearest neighbors.

Figure 7:
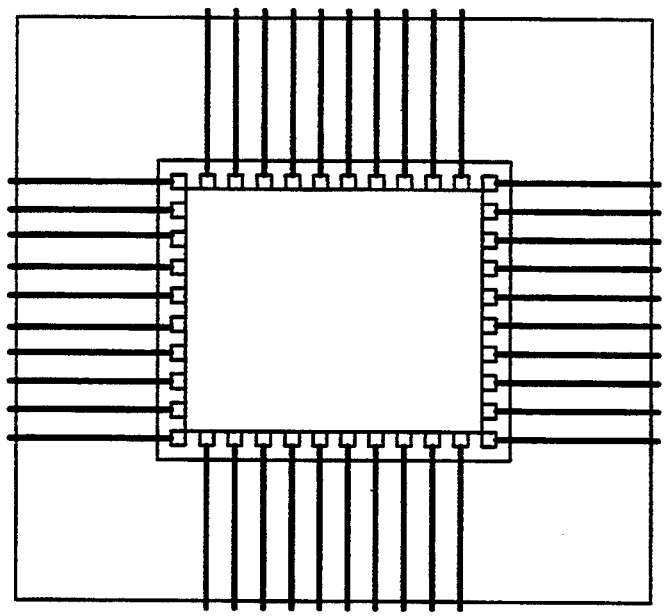
FIG. 7 is a representation of a typical TAB circuit.

Referring to FIG. 7, the twisted planar techniques can be applied to one type of IC bonds. In particular, crosstalk between bonds in tape automated bonding (TAB) can be reduced through an adaptation of the planar twisted pair transmission line techniques. TAB, which uses a thin flexible Kapton circuit board material as the substrate, with metal conductors on the top and bottom surfaces of the substrate, attaches an IC to the board through metal "fingers", formed on the top and-/or bottom surfaces, which extend past the board edge over the IC bond pads. The runners that lead to the fingers are generally relatively long, and can be adjacent with close spacing, and parallel. FIG. 7 shows a such a typical TAB circuit. Twisted-pair differential transmission lines can be used in such TAB circuits with horizontal virtual twists or vertical twists, and adjacent twisted-pair lines can be offset to minimize crosstalk.

Figure 8:
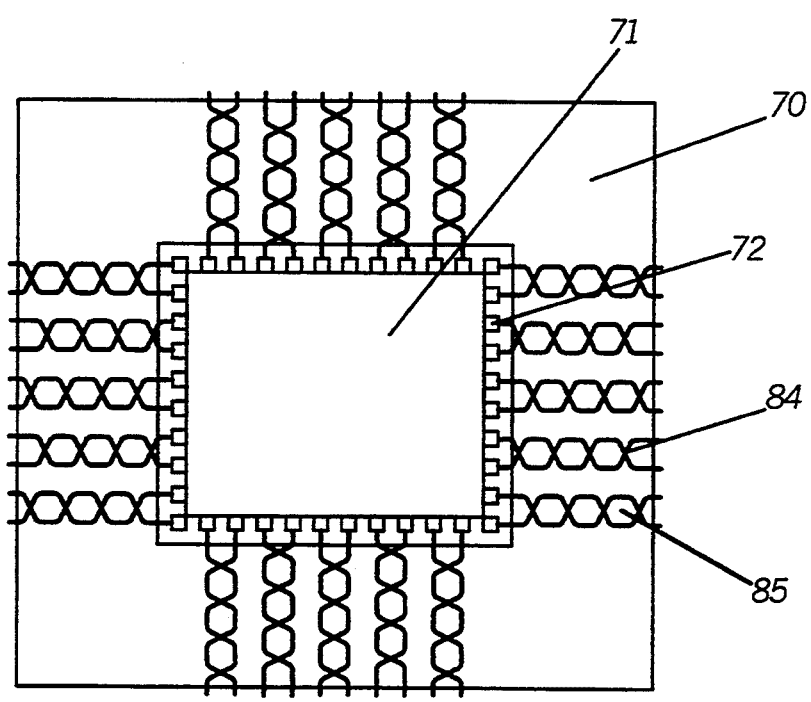
FIG. 8 is a representation of a TAB circuit with parallel twisted-pair conductor lines of FIG. 6.

Referring to FIG. 8, a TAB substrate with reduced crosstalk between adjacent transmission lines is shown. The substrate includes a common TAB circuit 70 with the conductors patterned in such a way as to have horizontal or vertically oriented differential twisted-pair transmission lines 84. Further yet, adjacent twisted-pair transmission lines 85 can be offset from the first set of transmission lines 84. With this structure, an IC 71 can be bonded (72) to the circuit 70 with minimal crosstalk between signal or conductor lines.

In summary, the invention provides a low-loss way of constructing a planar twisted-pair transmission line. Virtual twists are formed by two serpentine planar conductors, zigzagging, turning, or winding in opposed directions, but without crossing planes via any through-holes or otherwise making any electrical connection. Pictorially, the top planar conductor is winding in the shape of a first non-ideal pulse train while the second planar conductor is winding in the shape of a second non-ideal pulse train 180 degrees out of phase with the first train such that the virtual twisted-pair formed has overlaid crossed sections and successive parallel sections.

Since the vertical separation, between the planes, is small, the crossing of the conductors simulates a true twisted-pair transmission line.

To achieve a balanced twist in the vertically oriented transmission lines, the top conductor branches out to form a "U". The bottom conductor extends past the "U" where it is connected through a via to another section of top conductor that begins in the arms of the "U". The branches of the top "U" are connected with two or more vias to a bottom conductor "U".

By aligning the two adjacent pairs such that the conductor crossings, or twists, of one transmission line coincide with the parallel section of the other, or in other words, by placing the twists substantially in the center of the parallel sections, induced currents will cancel, resulting in reduced crosstalk.

What is claimed is:

1. A stacked twisted-pair differential transmission line structure comprising:
   a first bi-planar conductor having straight portions and successive turning portions, the turning portions winding through two planes in a first direction;
   a second bi-planar conductor having straight portions and successive turning portions, the turning portions winding in an opposite direction for forming a twisted-pair through the two planes;
   said turning portions comprising a first forcated planar conductive member having first forked sides; and
   a second forcated planar member located below the first forcated planar conductive member and having second forked sides wherein said second forcated member is narrower in width than said first forcated member.

2. The twisted-pair structure of claim 1 further comprising at least one first conductive through-hole formed through the forked sides for connecting the first and second forked members front-to-front and in longitudinal alignment.

3. The twisted-pair structure of claim 2 wherein the straight portions comprises:
   a narrow strip formed on the same plane as the second forcated planar member and fitting centrally within the forked sides; and
   a wide strip formed from on the same plane as the first forcated planar member and fitting centrally within the forked sides.

4. The twisted-pair structure of claim 3 further comprising a second conductive through-hole formed through the strips for connecting the strips front-to-front and in longitudinal alignment.

5. A twisted-pair conductor line structure comprising:
   a first forcated planar conductive member having first forked sides;
   a second forcated planar member below the first forcated planar conductive member, the second forcated member being thinner than the first forcated member and having second forked sides;
   at least one first conductive through-hole formed through the forked sides for connecting the first and second forked members front-to-front and in longitudinal alignment;
   a narrow strip formed on the same plane as the second forcated planar member and fitting centrally within the forked sides;
   a wide strip formed from on the same plane as the first forcated planar member and fitting centrally within the forked sides; and
   a second conductive through-hole formed through the strips for connecting the strips front-to-front and in longitudinal alignment.

* * * * *